(12) United States Patent
Gardes et al.

(10) Patent No.: US 7,404,249 B2
(45) Date of Patent: Jul. 29, 2008

(54) METHOD OF MANUFACTURING AN INDUCTANCE

(75) Inventors: Pascal Gardes, Tours (FR); Gérard Auriel, Chanceaux-sur-Choisille (FR)

(73) Assignee: STMicroelectronics S.A., Montrouge (FR)

( * ) Notice: Subject to any disclaimer, the term of this patent is extended or adjusted under 35 U.S.C. 154(b) by 311 days.

(21) Appl. No.: 10/268,648

(22) Filed: Oct. 10, 2002

(65) Prior Publication Data

US 2003/0066184 A1 Apr. 10, 2003

(30) Foreign Application Priority Data

Oct. 10, 2001 (FR) .................................. 01 13055

(51) Int. Cl.
*H01F 7/06* (2006.01)
(52) U.S. Cl. .................. 29/602.1; 438/653; 438/674; 438/675
(58) Field of Classification Search ............. 29/602.1, 29/606, 603.23, 603.25; 336/200; 438/674, 438/675, 653
See application file for complete search history.

(56) References Cited

U.S. PATENT DOCUMENTS

| 3,415,679 | A | * | 12/1968 | Chuss ..................... 438/675 X |
| 5,363,080 | A | | 11/1994 | Breen |
| 5,398,400 | A | | 3/1995 | Breen |
| 5,545,916 | A | | 8/1996 | Koullias |
| 6,211,073 | B1 | * | 4/2001 | Ahn et al. ..................... 438/653 |
| 6,417,755 | B1 | * | 7/2002 | Liu et al. ..................... 336/200 |
| 6,531,945 | B1 | * | 3/2003 | Ahn et al. ..................... 336/200 |
| 2001/0017395 | A1 | | 8/2001 | Takamura |

FOREIGN PATENT DOCUMENTS

| EP | 0 932 204 A1 | 7/1999 |
| EP | 1 054 417 A1 | 11/2000 |
| JP | 10-154797 | * 6/1998 |

OTHER PUBLICATIONS

Angelescu et al., "Electrical Characterization of Porous Silicon", CAS'95 Proceedings, 1995 International Semiconductor Conference, pp. 335-338, Oct. 1995.*
Nam et al., "High-Performance Planar Inductor on Thick Oxidized Porous Silicon (OPS) Substrate", IEEE Microwave and Guided Wave Letters, vol. 7, No. 8, pp. 236-238, Aug. 1997.*
Hayashi et al., "Multilayer Thin-Film Type of Magnetic Induction Device and Manufacturing Method Thereor", English Translation of Japanese Patent Application 10-303037.*
French Search Report from French Patent Application No. 01/13055, filed Oct. 10, 2001.
Patent Abstracts of Japan, vol. 1999, No. 02, Feb. 26, 1999 & JP 10 303037 A (Fuji Electric Co. Ltd.) Nov. 13, 1998.
"Method For Inductive Coil Fabrication" Research Disclosure, Kenneth Mason Publications, Hampshire, GB, No. 440, Dec. 2000, p. 2226.

* cited by examiner

*Primary Examiner*—A. Dexter Tugbang
(74) *Attorney, Agent, or Firm*—Lisa K. Jorgenson; James H. Morris; Wolf, Greenfield & Sacks, P.C.

(57) ABSTRACT

A method for manufacturing an inductance in a monolithic circuit including a substrate of planar upper surface, including the steps of forming in the substrate a cavity substantially following the contour of the inductance to be formed, the cross-section of the cavity being deep with respect to its width; and filling the cavity with a conductive material.

14 Claims, 2 Drawing Sheets

METHOD OF MANUFACTURING AN INDUCTANCE

BACKGROUND OF THE INVENTION

1. Field of the Invention

The present invention relates to a method for manufacturing an inductance in a monolithic circuit. More specifically, it relates to the manufacturing of an inductance in a monolithic circuit integrating a limited number of passive elements, such as inductors, resistors and capacitors, and possibly a limited number of active elements, such as a protection diode.

2. Discussion of the Related Art

FIG. 1 shows a cross-section view of a monolithic circuit including an inductance 10 formed conventionally. A semiconductor 11, for example, made of silicon, is covered with a multiple-layer formed of an insulating layer 12, for example, silicon oxide, and of first and second passivation layers 13, 14. Inductance 10 rests on the external surface of the first passivation layer 13.

FIG. 2 shows a cross-section view of inductance 10 along lines A-A of FIG. 1. Inductance 10 is formed of a conductive track 15 arranged in a spiral and having first and second ends 16 and 17, first end 16 being located substantially at the center of the spiral. Second end 17 is connected to a pad 20. First end 16 is connected to a pad 21, via vias 22, 23, formed in first passivation layer 13, and a metal portion 24 deposited on insulating layer 12. Pads 20 and 21 belong to a set of pads intended for the direct assembly of the upper surface of the monolithic circuit on a printed circuit.

Inductance 10 is formed after forming in substrate 11 of possible active components. Inductance 10 may be obtained by the deposition, on first passivation layer 13, of a metal layer, for example, aluminum, covered with a mask, and then anisotropically etched. The portions of the metal area which are not protected by the mask form conductive track 15 and ends 16, 17 of inductance 10. Finally, second passivation layer 14 is deposited and pads 20 and 21 are formed. First passivation layer 13 especially has the function of moving inductance 10 away from substrate 11 to limit the couplings therebetween.

Inductance 10 has a series resistance having the following formula:

$$R = \rho \times l/S$$

where $\rho$ is the resistivity of the material forming inductance 10, l is the length of conductive track 15, and S is the surface area of the cross-section of conductive track 15. Conventionally, the cross-section of conductive track 15 is substantially rectangular and S is defined by S=d×w, where d corresponds to the thickness of conductive track 15, that is, substantially the thickness of the metal deposited on first passivation layer 13, and w is the width of conductive track 15 as is shown in FIG. 1. Inductance 10 also exhibits a quality factor which corresponds to the ratio between the exchanged power (magnetic power) and the lost power (ohmic losses). Its value is given, for frequencies smaller than 500 Mhz, by the following formula:

$$Q = L \times \omega / R_{DC}$$

where $\omega$ is the pulse of the current flowing through inductance 10, L is the value of the inductance and $R_{DC}$ is the equivalent series resistance of the low-frequency inductance (that is, for frequencies smaller than 500 MHz), which is equal to the series resistance provided by the above formula.

According to the previously-described conventional method of forming an inductance 10, the obtained values of the series resistance of inductance 10 exhibit a dispersion of approximately 5%, due to the dispersions cumulated both by the metal deposition step on first passivation layer 13, and the metal etching. This dispersion causes a dispersion of the quality factor of the inductance. Practically, such a dispersion may cause matching problems upon subsequent use of the monolithic circuit.

Further, thickness d of inductance 10 is limited both by the technology used for the metal deposition and by the fact that this deposition must be covered by second passivation layer 14. Indeed, due to the presence of inductance 10, the surface on which second passivation layer 14 is formed exhibits an irregular relief that may cause stress distribution inhomogeneities in second passivation layer 14, that may result in layer breakages. This is why thickness d is generally maintained at less than 3 μm. This makes difficult the obtaining of very small series resistance values and high quality factors, if it is not desired to increase width w and thus the surface area taken up by the inductance.

SUMMARY OF THE INVENTION

The present invention aims at obtaining a monolithic circuit inductance that can exhibit high thicknesses.

It also aims at obtaining an inductance which eases the forming of passivation layers.

To achieve these and other objects, the present invention provides a method for manufacturing an inductance in a monolithic circuit including a substrate of planar upper surface, including the steps of forming in the substrate a cavity substantially following the contour of the inductance to be formed, the cross-section of the cavity being deep as compared to its width; forming an insulation region of the inductance, comprising forming a porous silicon region at the level of the cavity, then oxidizing said porous silicon region and filling the cavity with a conductive material.

According to an embodiment of the present invention, the cavity is from 5 to 10 times deeper than it is wide.

According to an embodiment of the present invention, the cross-section of the cavity has a thickness greater than 10 μm and a width on the order of from 1 to 2 μm.

The present invention also provides an inductance formed in a monolithic circuit, including a silicon substrate of planar upper surface, the inductance being at least partly housed in a cavity of the substrate, the cross-section of which is deep as compared to its width, and levels the upper surface of the substrate, the inductance being insulated from the substrate by an insulating region, comprising an oxidized porous silicon region.

The foregoing objects, features, and advantages of the present invention, will be discussed in detail in the following non-limiting description of specific embodiments in connection with the accompanying drawings.

DETAILED DESCRIPTION

It should be noted that in the different drawings, as usual in the representation of monolithic circuits, the thicknesses and lateral dimensions of the various layers are drawn to scale neither within a same drawing nor from one drawing to the other, to improve the readability of the drawings. Further, the same references will refer to the same layer elements, possibly at successive manufacturing steps.

Figure 2:
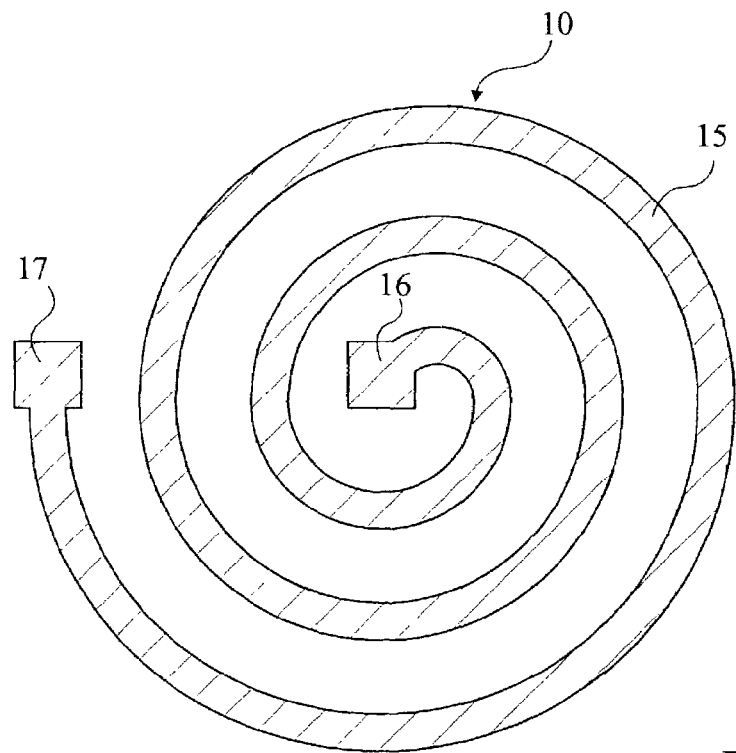
FIG. 2, previously described, shows a cross-section view of FIG. 1 along lines A-A.
Figure 3:
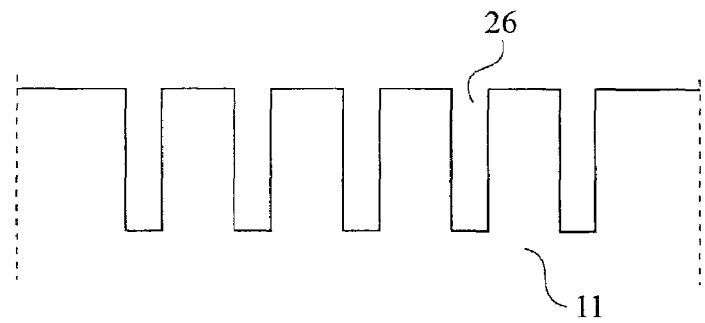
FIGS. 3 to 5 show cross-section views of a monolithic circuits at different steps of the manufacturing method of an inductance according to a first embodiment of the present invention.

FIG. 3 shows a semiconductor substrate 11, for example, made of silicon, in which a cavity 26 having a depth which is a function of the desired thickness d of inductance 10 has been formed. Cavity 26 may be obtained by an anisotropic etch of substrate 11 covered with a mask (not shown) which exposes a portion of substrate 11 according to a pattern approximately having the shape of FIG. 2. The obtained cavity 26 thus substantially follows the contour of inductance 10.

Figure 4:
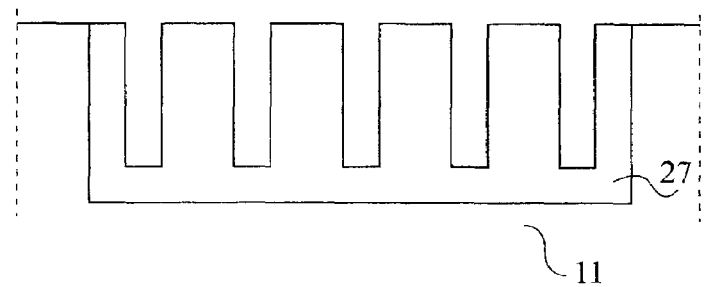

FIG. 4 shows substrate 11, in which are successively performed a localized electrolysis to obtain a porous silicon area surrounding cavity 26, and an oxidation of the porous area to form an insulating region 27. A metal layer, for example, aluminum, is then deposited in cavity 26. A copper deposition may also be obtained by electrolysis.

Figure 5:
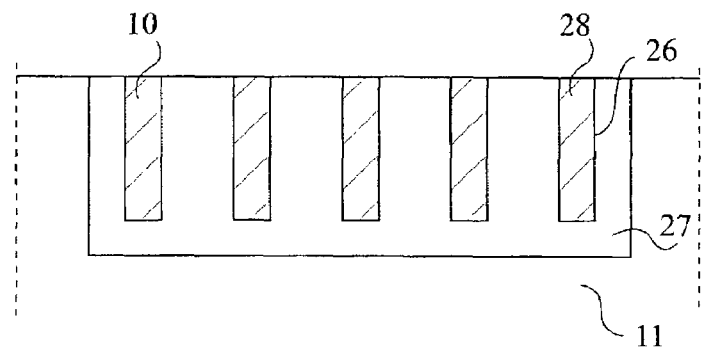

FIG. 5 shows cavity 26 filled with the metal material after a so-called step of planarization of the surface of substrate 11 at the level of inductance 10. The planarization may be performed by a method of chem-mech polishing type (CMP) in which the metal portions protruding with respect to the external surface of substrate 11 are removed.

An inductance 10 integrated to substrate 11, and insulated therefrom by insulating region 27 is thus obtained. The assembly formed by substrate 11, insulating region 27, and inductance 10 exhibits a substantially planar upper surface area. As an example, an inductance 10 exhibiting a thickness of 10 μm and a width of 1.5 μm may be formed according to the present invention.

Figure 6:
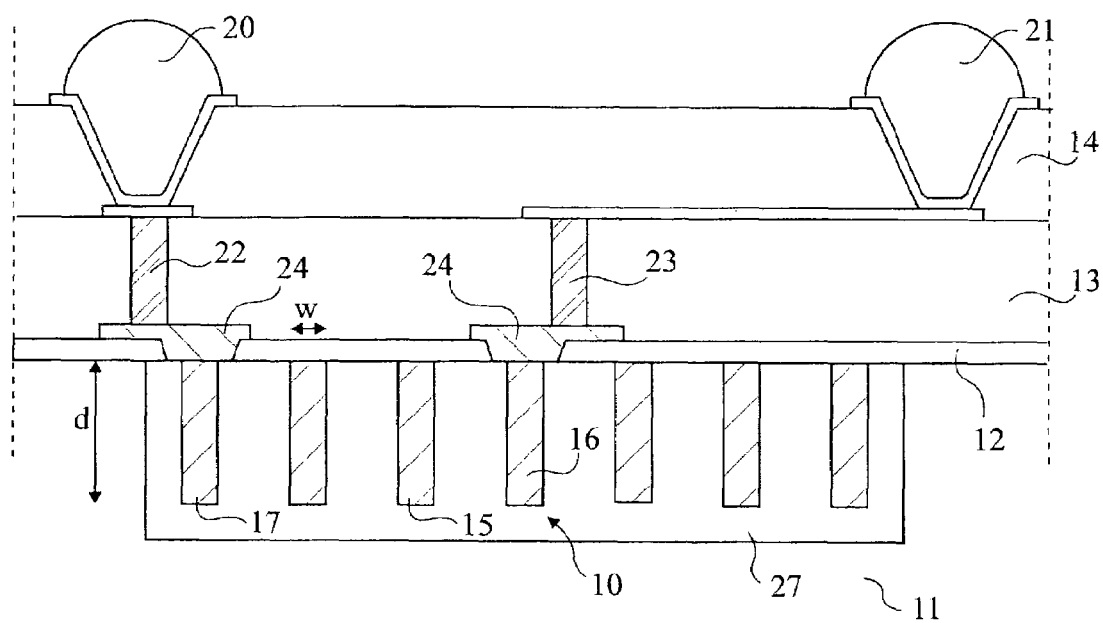
FIG. 6 shows a cross-section view of a monolithic circuit including an inductance according to the first embodiment of the present invention.

FIG. 6 shows a cross-section view of a monolithic circuit including an inductance 10 formed according to the first embodiment of the present invention. Ends 16, 17 of inductance 10 are conventionally connected to pads 20, 21 via vias 22, 23 and metal portions.

Figure 1:
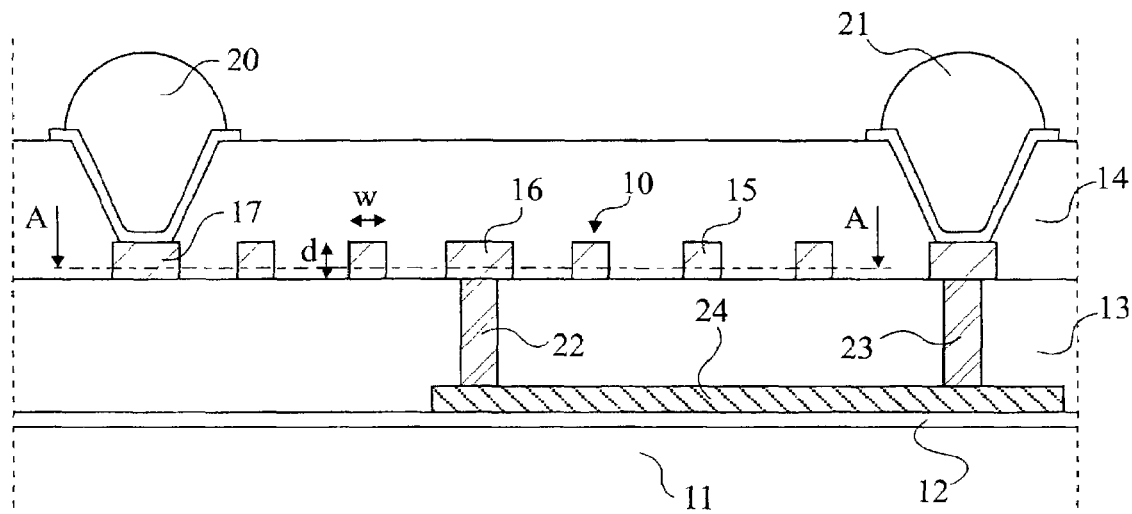
FIG. 1, previously described, shows a cross-section view of a monolithic circuit including an inductance obtained according to a conventional manufacturing method.

As compared to the structure shown in FIG. 1, the present invention has many advantages.

A first advantage results in the fact that, inductance 10 being integrated to substrate 11, the deposition of the first and second passivation layers 13, 14 is eased. Indeed, inductance 10 no longer takes part in the surface unevenness which embrittles second passivation layer 14. Thus, the second passivation layer is formed on a more even surface. Further, the forming of inductance 10 at the level of substrate 11 does not disturb the forming of first passivation layer 13 either, since the assembly formed by substrate 11 and inductance 10 has a substantially planar external surface. The component reliability is thus improved by decreasing the risk of passivation breakage.

Another advantage of the present invention is that the inductance 10 may exhibit a significant thickness d as compared to that of a conventional inductance. Indeed, currently-used technologies enable deeply etching substrate 11, for example, down to a depth of from 10 to 20 μm. For a same length l of inductance 10, increasing thickness d decreases the series resistance and thus provides an inductance 10 with a small voltage drop and low ohmic losses. Further, for a constant series resistance and for a given number of turns, the increase in thickness d enables reducing width w and thus length l, which results in a decrease in the surface area taken up by inductance 10 on substrate 11.

Another advantage of the present invention is the obtaining of a better control of the thickness of inductance 10 upon its forming. The series resistance dispersion and, accordingly, the dispersion of the quality factor of inductances 10, are thus decreased.

Another advantage of the present invention is that the resistive and capacitive couplings of inductance 10 with substrate 11 are remarkably reduced. Inductance 10 is then efficiently insulated from substrate 11 and the quality factor is improved.

Of course, the present invention is likely to have various alterations, modifications, and improvements which will readily occur to those skilled in the art. In particular, the inductance may be arranged other than in spiral. The cross-section of the conductive track may be other than rectangular.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an inductance in a monolithic circuit including a silicon substrate of planar upper surface, including the steps of:
   forming in the silicon substrate a cavity substantially following a contour of the inductance to be formed, a cross-section of the cavity being deep as compared to a width of the cavity;
   after forming the cavity in the silicon substrate, forming an insulation region of the inductance, comprising forming a porous silicon region in the silicon substrate such that the porous silicon region contacts the cavity, then oxidizing said porous silicon region; and
   filling the cavity with a conductive material.

2. The method for forming an inductance of claim 1, wherein the cavity is from 5 to 10 times deeper than the width.

3. The method for forming an inductance of claim 2, wherein the cross-section of the cavity has a thickness greater than 10 μm and the width is between 1 and 2 μm.

4. A method of forming an inductor in a semiconductor substrate, the method comprising:
   forming a cavity in the semiconductor substrate;
   after forming the cavity in the semiconductor substrate, forming a porous region in the semiconductor substrate such that the porous region contacts the cavity;
   oxidizing the porous region; and
   forming a conductive region within the cavity.

5. The method of claim 4, wherein the semiconductor substrate is a silicon substrate.

6. The method of claim 4, wherein a depth of the cavity is greater than a width of the cavity.

7. The method of claim 6, wherein the depth is between 5 and 10 times greater than the width.

8. The method of claim 4, wherein the forming of the cavity is performed prior to the forming of the porous region.

9. The method of claim 4, wherein the forming of the porous region is performed prior to the oxidizing of the porous region.

10. The method of claim 4, wherein the oxidizing of the porous region converts the porous region into an insulating region.

11. The method of claim 4, wherein the inductor is a spiral inductor.

12. The method of claim 4, wherein the conductive region substantially fills the cavity.

13. The method of claim 12, wherein a depth of the conductive region is at least 10 μm.

14. The method of claim 4, wherein the conductive region is a metal region.

* * * * *

UNITED STATES PATENT AND TRADEMARK OFFICE
CERTIFICATE OF CORRECTION

PATENT NO. : 7,404,249 B2
APPLICATION NO. : 10/268648
DATED : July 29, 2008
INVENTOR(S) : Pascal Gardes et al.

Page 1 of 1

It is certified that error appears in the above-identified patent and that said Letters Patent is hereby corrected as shown below:

Col. 3, line 59 should read:
length $\ell$ of inductance 10, increasing thickness d decreases
    line 64 should read:
length $\ell$, which results in a decrease in the surface area taken Signed and Sealed this Sixteenth Day of September, 2008

JON W. DUDAS
*Director of the United States Patent and Trademark Office*